United States Patent
Ito (10) Patent No.: US 9,070,876 B2
(45) Date of Patent: Jun. 30, 2015

(54) VARIABLE RESISTANCE ELEMENT AND SEMICONDUCTOR STORAGE DEVICE

(75) Inventor: Kimihiko Ito, Tokyo (JP)

(73) Assignee: NEC Corporation, Tokyo (JP)

( * ) Notice: Subject to any disclaimer, the term of this patent is extended or adjusted under 35 U.S.C. 154(b) by 29 days.

(21) Appl. No.: 14/004,121

(22) PCT Filed: Nov. 15, 2011

(86) PCT No.: PCT/JP2011/076742
§ 371 (c)(1),
(2), (4) Date: Sep. 9, 2013

(87) PCT Pub. No.: WO2012/127735
PCT Pub. Date: Sep. 27, 2012

(65) Prior Publication Data
US 2013/0341585 A1    Dec. 26, 2013

(30) Foreign Application Priority Data
Mar. 18, 2011   (JP) ................. 2011-060327

(51) Int. Cl.
*H01L 47/00* (2006.01)
*H01L 45/00* (2006.01)
*H01L 27/24* (2006.01)

(52) U.S. Cl.
CPC .......... *H01L 45/145* (2013.01); *H01L 27/2436* (2013.01); *H01L 45/04* (2013.01); *H01L 45/1233* (2013.01); *H01L 45/146* (2013.01)

(58) Field of Classification Search
CPC ...................................................... H01L 45/04
USPC ............. 257/1–5, E27.06, E21.003; 438/95, 438/104, 142, 382, 385
See application file for complete search history.

(56) References Cited

U.S. PATENT DOCUMENTS

| | | | |
|---|---|---|---|
| 7,759,771 B2 | 7/2010 | Lee et al. | |
| 2008/0164568 A1 | 7/2008 | Lee et al. | |
| 2009/0039332 A1* | 2/2009 | Lee et al. | 257/4 |
| 2010/0038615 A1 | 2/2010 | Nakagawa | |
| 2010/0078615 A1 | 4/2010 | Ito | |
| 2011/0001110 A1 | 1/2011 | Takahashi | |
| 2011/0062407 A1* | 3/2011 | Kamata et al. | 257/4 |

FOREIGN PATENT DOCUMENTS

| | | | |
|---|---|---|---|
| JP | 2008-166768 A | 7/2008 | |
| WO | WO 2008/062623 A1 | 5/2008 | |

(Continued)

OTHER PUBLICATIONS

International Search Report (ISR) (PCT Form PCT/ISA/210), in PCT/JP2011/076742, dated Jan. 31, 2012.
Solid State Electronics vol. 7, pp. 785 to 797, (Solid State Electronics, vol. 7, p. 785-797, 1964).

(Continued)

*Primary Examiner* — Mark A Laurenzi
(74) *Attorney, Agent, or Firm* — McGinn IP Law Group, PLLC (57) ABSTRACT

A variable resistance element is formed by sandwiching a metal oxide layer whose resistance changes between a pair of electrodes and the metal oxide layer includes a pair of variable resistance layers whose resistances change by formation of a current path and a branching suppression layer which is sandwiched between the variable resistance layers and suppresses branching of the current path.

12 Claims, 8 Drawing Sheets

(56) References Cited

FOREIGN PATENT DOCUMENTS

| | | |
|---|---|---|
| WO | WO 2008/102718 A1 | 8/2008 |
| WO | WO 2009/125777 A1 | 10/2009 |

OTHER PUBLICATIONS

Solid State Electronics vol. 7, pp. 785 to 797, (Solid State Electronics, vol. 7, p. 785-797) 1964.

\* cited by examiner

Fig.11A
HIGH RESISTANCE → LOW RESISTANCE

Fig.11B
LOW RESISTANCE → HIGH RESISTANCE

WHEN APPLYING VOLTAGE EQUAL TO OR GREATER THAN $V_{t1}$ IN OFF STATE, IT IS SWITCHED TO ON STATE

WHEN APPLYING VOLTAGE EQUAL TO OR GREATER THAN $V_{t2}$ IN ON STATE, IT IS SWITCHED TO OFF STATE

VARIABLE RESISTANCE ELEMENT AND SEMICONDUCTOR STORAGE DEVICE

TECHNICAL FIELD

The present invention relates to a variable resistance element and a semiconductor storage device and in particular relates to a resistance change type non-volatile variable resistance element and a semiconductor storage device.

BACKGROUND ART

The most common non-volatile memory in the market today that is represented by a flash memory, a SONOS (Silicon-Oxide-Nitride-Oxide-Silicon) memory, or the like uses a technology by which a threshold voltage of a semiconductor transistor is changed by storing an electric charge in an insulating film formed on a channel.

In order to realize a large capacity non-volatile memory, a fine element structure has to be developed and used. However, a today's fine processing technology almost reaches a limit of processing or the like. Accordingly, it is difficult to miniaturize even a single semiconductor transistor.

Accordingly, an idea in which the transistor has only a function to select a memory cell used for reading and writing (acts as a switching element) and a structure in which a storage element and the switching element are separated from each other like a DRAM (Dynamic Random Access Memory) is used is considered to realize a large capacity non-volatile memory.

In this case, a variable resistance element whose electric resistance value changes between two or more values when some electrical stimulus is given may be used.

However, an electrical characteristic required when the variable resistance element is used as the storage element is different from that required when the variable resistance element is used as the switching element for performing a switching between the wirings.

Namely, when it is used as the storage element, because the variable resistance element is connected in series to an active element such as a transistor or a diode which selects the storage element, a resistance value of the variable resistance element may be about 1 kΩ in a low-resistance state and it is required to be about 100 kΩ in a high-resistance state. Namely, the resistance value of the variable resistance element has to be changed by two orders between an ON state and an OFF state.

Figure 9:
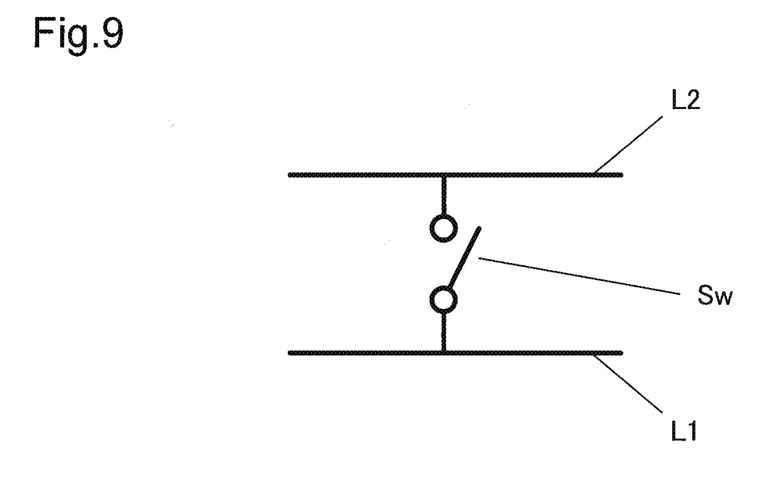
FIG. 9 is a figure illustrating an example of a utilization form of a variable resistance element applied to a description of the related technology.

In contrast, when the variable resistance element is arranged between wirings L1 and L2 to configure a switch Sw as shown in FIG. 9, it is required that the resistance value of the variable resistance element in the low-resistance state is equal to a resistance value (for example, 100Ω or less) of the wiring and the resistance value of the variable resistance element in the high-resistance state is 100 MΩ or more to surely cut off a signal.

Accordingly, the variable resistance element has to be produced so that it has an electrical characteristic according to the use.

Figure 10:
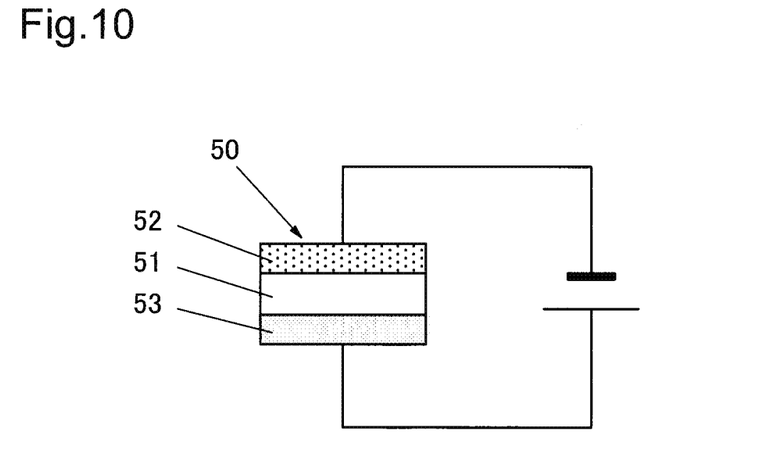
FIG. 10 is a figure illustrating a structure of a variable resistance element applied to a description of the related technology.

The various structures are proposed for the variable resistance element. FIG. 10 is a schematic sectional view of a variable resistance element 50 having a metal/metal oxide/metal (hereinafter, referred to as MIM type) structure in which a metal oxide is sandwiched between electrodes. In this variable resistance element 50, a metal oxide film 51 with a resistance change characteristic is arranged between electrodes 52 and 53 that are made of Pt, Ru, or the like. The resistance state is changed by applying a predetermined voltage-current stimulus between the electrodes 52 and 53 from the outside. Further, even when a power supply is disconnected, the resistance state is maintained without being volatilized.

It is disclosed to use NiO (nickel oxide) as the metal oxide film 51 (refer to non-patent document 1). It is proposed to use Ti oxide, Hf oxide, Zr oxide, Zn oxide, W oxide, Co oxide, and Nb oxide as the metal oxide film 51 (refer to patent document 1).

Figure 11A:
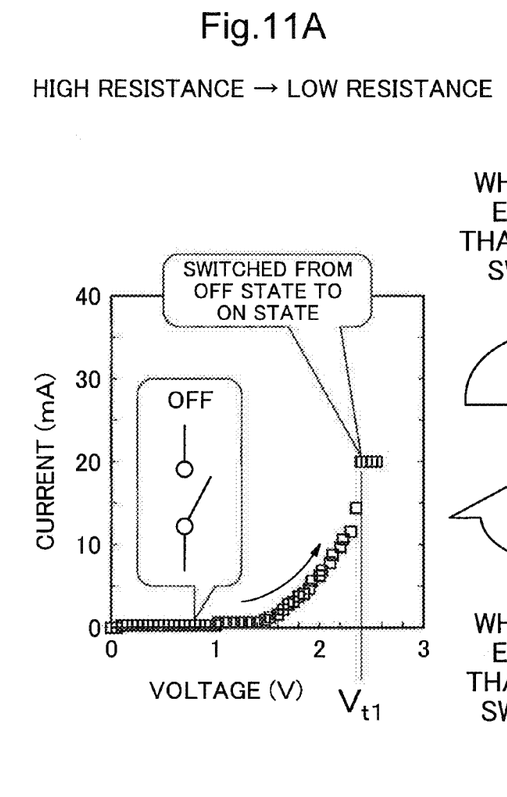
FIG. 11(a) is a characteristic figure showing a transition from an OFF state that is a high-resistance state and FIG. 11(b) is a characteristic figure showing a transition from an ON state.
Figure 11B:
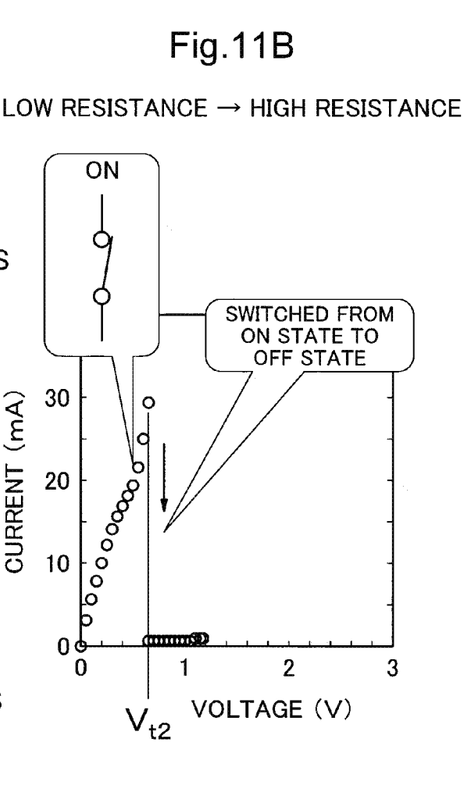

FIG. 11 is a figure showing an example of a current-voltage characteristic of an MIM type variable resistance element. FIG. 11(a) shows an electrical characteristic of the variable resistance element in a case in which a voltage that is equal to or higher than Vt1 is applied to the variable resistance element in the OFF state that is the high-resistance state and the state of the variable resistance element is changed to the ON state that is the low-resistance state. FIG. 11(b) shows an electrical characteristic of a variable resistance element in a case in which a voltage that is equal to or higher than Vt2 is applied to the variable resistance element in the ON state and the state of the variable resistance element is changed to the OFF state that is the high-resistance state.

In such variable resistance element, a current path in the low-resistance state is not distributed and formed over the entire surface of the electrode and is formed locally. A diameter of the current path is about several nm and even in a large case, it is several 10 nm.

[patent document 1] Japanese Patent Application Laid-Open No. 2008-166768
[non-patent document 1] Solid State Electronics vol. 7, pp. 785 to 797, (Solid State Electronics, Vol. 7, P. 785-797, 1964.)

BRIEF SUMMARY OF THE INVENTION

Problems to be Solved by the Invention

However, in the structure described in patent document 1 and non-patent document 1, a problem in which a resistance value of the current path that is a resistance value in the ON/OFF state greatly varies occurs.

Accordingly, a main purpose of the present invention is to provide a variable resistance element of which variation in the resistance value in the ON/OFF state is suppressed and a semiconductor storage device.

Means for Solving the Problems

In order to solve the above-mentioned problem, the variable resistance element according to the present invention is characterized in that the variable resistance element is formed by sandwiching a metal oxide layer whose resistance changes between a pair of electrodes and the metal oxide layer includes a pair of variable resistance layers whose resistances change by formation of a current path and a branching suppression layer which is sandwiched between the variable resistance layers and suppresses branching of the current path.

Effect of the Invention

In the present invention, because the branching suppression layer is provided, even when the state of the variable resistance element transits to the ON state or the OFF state, the variation in the resistance value at the time of transition can be suppressed.

BRIEF DESCRIPTION OF THE DRAWINGS

FIG. 11 is a figure showing an example of a current-voltage characteristic of a variable resistance element applied to a description of the related technology.

MOST PREFERRED MODE FOR CARRYING OUT THE INVENTION

An exemplary embodiment of the present invention will be described. The variable resistance element may be used as not only a switch that controls interconnection between wirings but also a storage element. In the following explanation of the exemplary embodiment, a case in which the variable resistance element functions as a switch is taken as an example.

Figure 1:
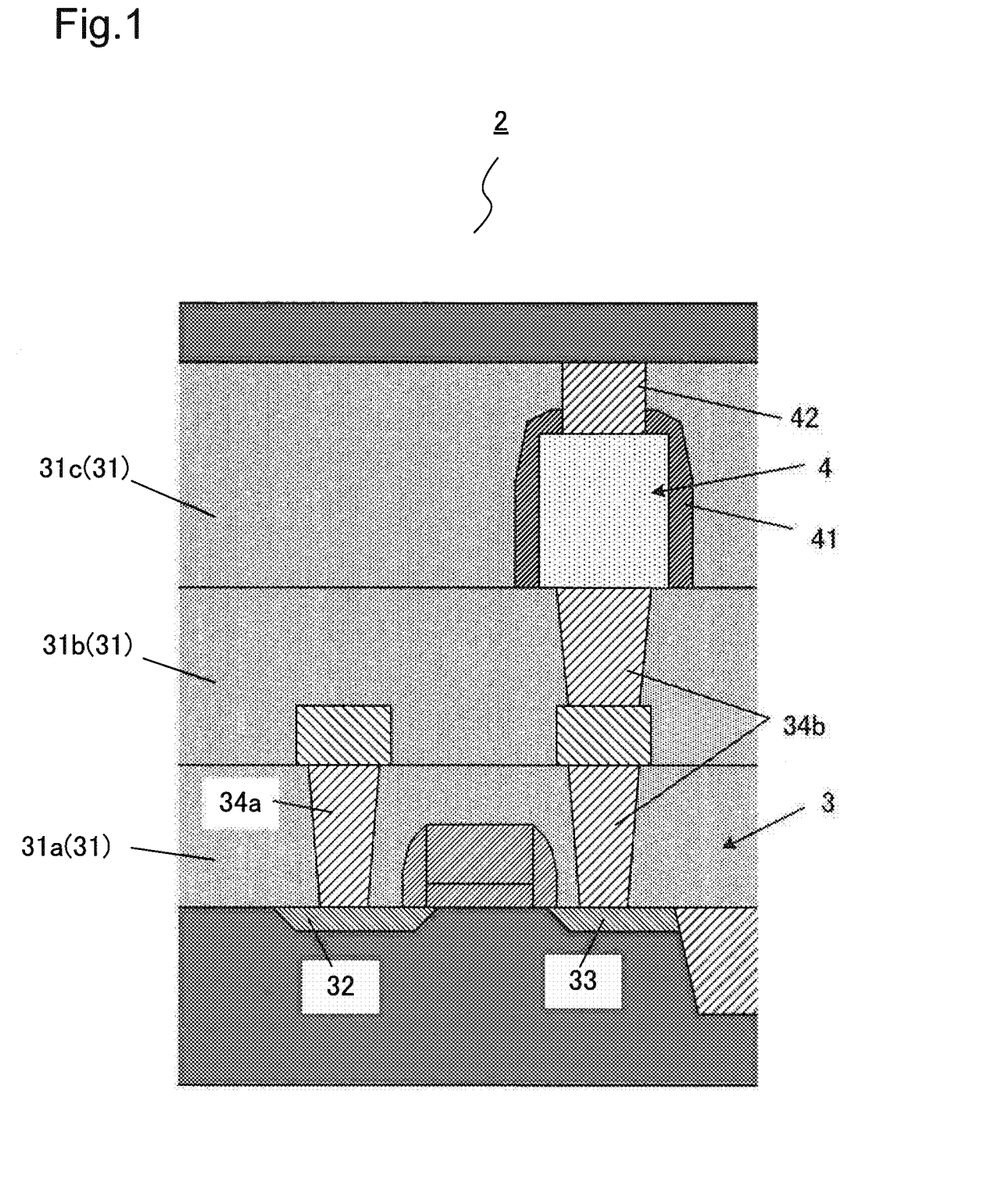
FIG. 1 is a sectional view of a semiconductor storage device using a variable resistance element according to an exemplary embodiment of the present invention.

FIG. 1 is a sectional view of a semiconductor storage device using a variable resistance element according to an exemplary embodiment of the present invention. This semiconductor storage device 2 includes a transistor 3 and a variable resistance element 4 as a main structure.

The transistor 3 is formed on a semiconductor substrate made of Si or the like and an interlayer insulating film 31 (31a, 31b, and 31c) is formed on it. A source 32 and a drain 33 of the transistor 3 are connected to wirings 34a and 34b including a metal such as W, Al, Cu, or the like provided through the interlayer insulating films 31a and 31b.

The variable resistance element 4 connected to the transistor 3 via the wiring 34b is formed on the interlayer insulating film 31b.

The variable resistance element 4 is covered by a barrier property insulator 41 and connected to the wiring 34b and a wiring 42.

Figure 2:
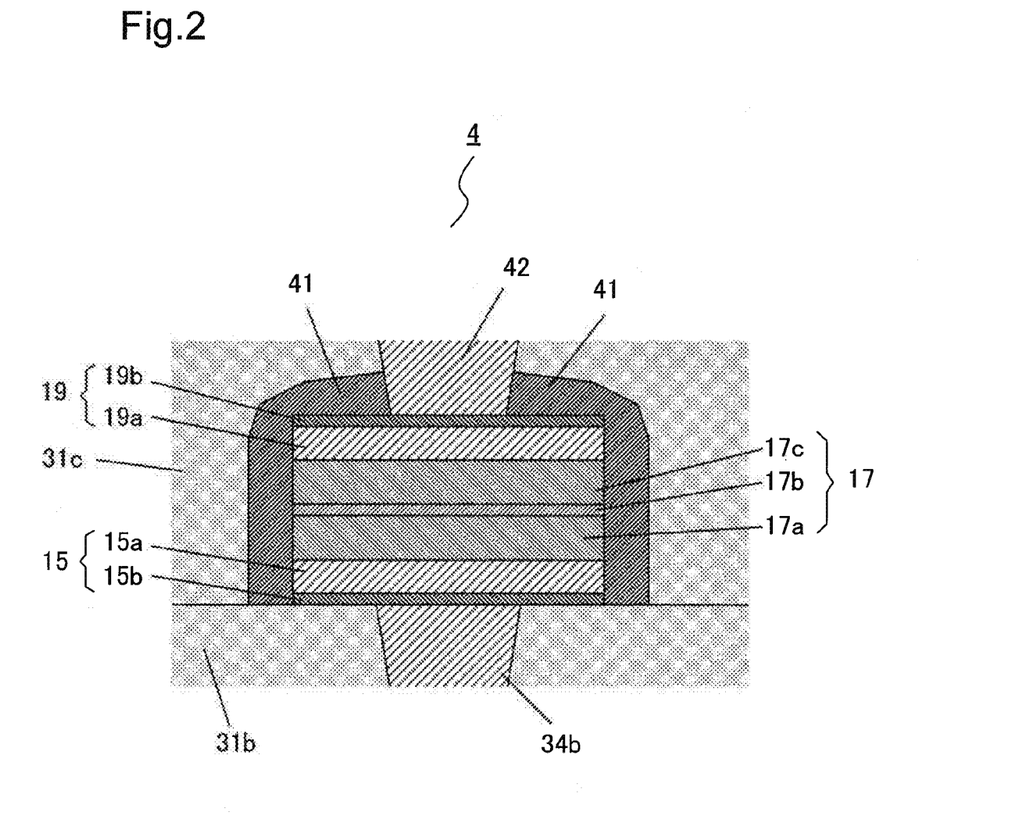
FIG. 2 is a sectional view of a variable resistance element according to an exemplary embodiment.

FIG. 2 is a detailed sectional view of the variable resistance element 4. The variable resistance element 4 is formed by stacking a lower electrode portion 15, a metal oxide layer 17, and an upper electrode portion 19 in this order.

The lower electrode portion 15 includes a barrier layer 15b and a lower electrode 15a and the upper electrode portion 19 includes an upper electrode 19a and a barrier layer 19b. The metal oxide layer 17 includes a variable resistance layer 17a, a branching suppression layer 17b, and a variable resistance layer 17c. The composition of the variable resistance layer 17a is the same as that of the variable resistance layer 17c.

Figure 3:
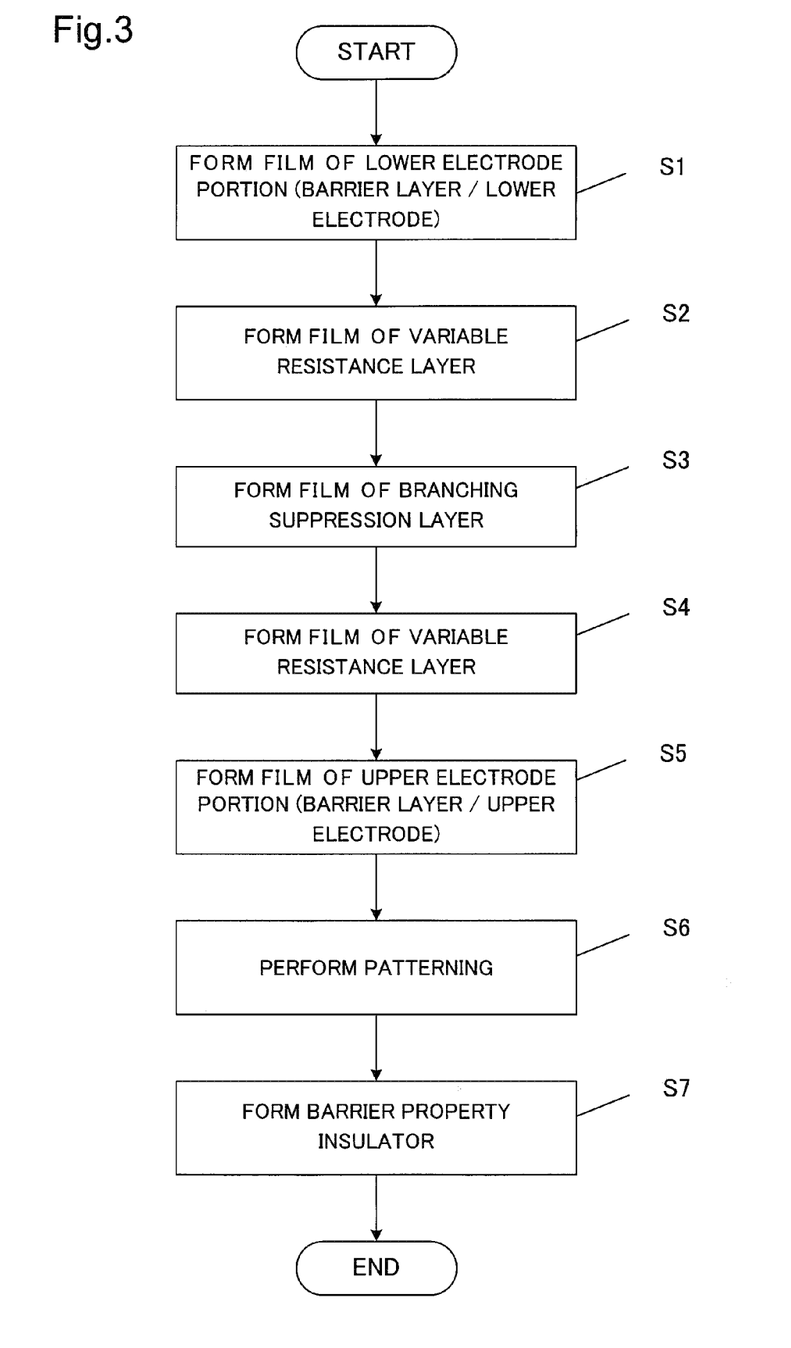
FIG. 3 is a flowchart showing a manufacturing procedure of a variable resistance element according to an exemplary embodiment.

Next, a detailed structure of the above-mentioned variable resistance element 4 will be described with a manufacturing method. FIG. 3 is a flowchart showing a manufacturing procedure of the variable resistance element 4.

Step S1: First, the barrier layer 15b and the lower electrode 15a are formed on the wiring 34 from the interlayer insulating film 31b. The barrier layer 15b includes at least one from among TiN, TaN, WN, MoN, and the like. Further, the lower electrode 15a includes at least one metallic element from among the elements such as Ni, Cu, Co, and the like (hereinafter, described as a first metallic element).

Step S2: Next, the variable resistance layer 17a is formed. The variable resistance layer 17a includes an oxide of the first metallic element.

Step S3: The branching suppression layer 17b is formed on the variable resistance layer 17a. In the branching suppression layer 17b, one of the first metallic elements such as Ni, Cu, Co, and the like included in the variable resistance layer 17a is substituted by one of the elements such as Al, Ti, Zr, Hf, Ta, W, Mo, and the like (hereinafter, described as a second metallic element) that can be ionized into the trivalent or more state.

Step S4: The variable resistance layer 17c is formed on the branching suppression layer 17b.

The variable resistance layer 17a, the branching suppression layer 17b, and the variable resistance layer 17c can be formed by using a CVD (Chemical Vapor Deposition) method, a sputtering method, or a sol-gel method. For example, when the branching suppression layer 17b is formed by the CVD method, the raw materials including the first metallic element and the second metallic element are supplied to a reaction tank simultaneously to form the branching suppression layer 17b. When the sputtering method is used, the first metallic element and the second metallic element are mixed so as to obtain a desired composition ratio and a sintered target is used as the oxide.

A desirable amount of the second metallic element included in the branching suppression layer 17b is for example, 0.01 mol % to 50 mol % because its amount does not change a resistance value in the low-resistance state.

A desirable film thickness of the variable resistance layer 17c including only the first metallic element is 0.1 nm to 3 nm. Further, a desirable film thickness of the variable resistance layer 17a is 0.1 nm to 1 nm.

Step S5: After the metal oxide layer 17 is formed by the above-mention process, the upper electrode portion 19 is formed by using a method that is the same as the method used for the lower electrode portion 15.

Step S6: A patterning is performed to a pattern of the variable resistance element 4 by using a photolithography, a dry etching, or the like.

Step S7: The barrier property insulator 41 is formed. The variable resistance element 4 is covered by this barrier property insulator 41. The barrier layers 15b and 19b and the barrier property insulator 41 perform an action to suppress the spreading of the element included in the variable resistance element 4. $Si_3N_4$, SiCN, SiC, $Al_2O_3$, or the like is used.

Thus, in the variable resistance element 4 according to the present invention, the branching suppression layer 17b is sandwiched between the variable resistance layers 17a and 17c.

When a voltage is applied to the variable resistance element 4 in an initial state, a germ of the current path (a starting point of the current path) is formed and the current path is formed when the germ grows. Hereinafter, a voltage required to form a current route is called a forming voltage. An operation in which the state is first transferred from an initial high-resistance state to the low-resistance state is described as a forming process.

Namely, when the forming voltage is applied on the variable resistance element, the germ of the current path is generated. A hole and an electron are injected in this germ or the growing current path. By the injected carrier, an electric field at a head of the path becomes large (electric field concentration occurs). By this electric field concentration, the current path continuously grows and reaches the electrode. However, because the state of electric field concentration is a higher energy state, energy dispersion occurs. Namely, the branching of the current path occurs. When the branching of the current path occurs, the low-resistance state occurs according to the branching state. Accordingly, in this exemplary embodiment, the branching suppression layer 17b for suppressing the branching of the current path is provided.

As a parent metal of the branching suppression layer 17b, a material that is the same as that of the variable resistance layers 17a and 17c including the first metallic element such as Ni, Cu, Co, or the like is used and the branching suppression layer 17b is formed by using the second metallic element such as Al, Ti, Zr, Hf, Ta, W, Mo, and the like that can be ionized into the trivalent or more state as an addition agent. The first metallic element is substituted by this second metallic element.

When the first metallic element is substituted by the second metallic element, a deficit occurs at a substitution site. By this, a quantity of generated holes decreases. Therefore, it is believed that the branching of the current path is suppressed.

Figure 4:
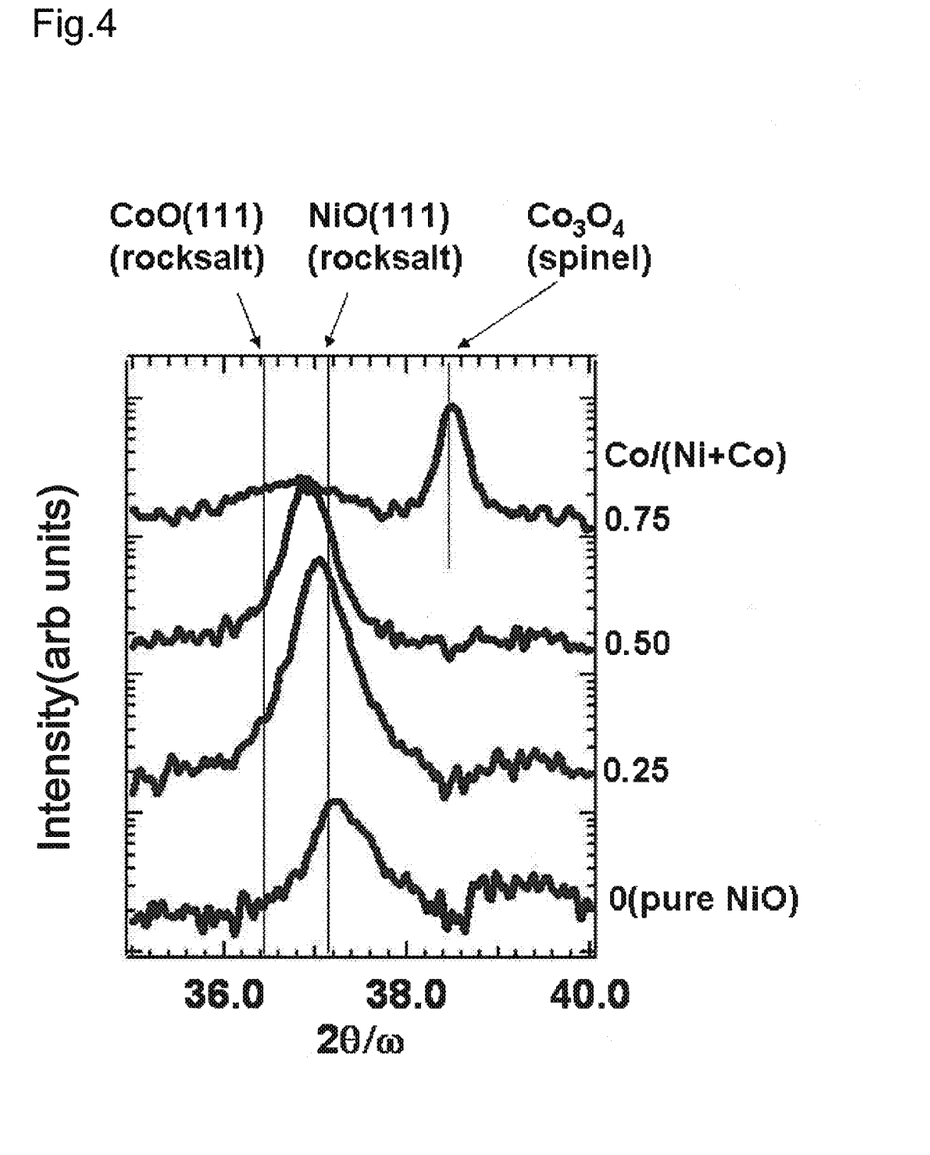
FIG. 4 is X-ray diffraction data of a metal oxide film according to an exemplary embodiment.

FIG. 4 is X-ray diffraction data indicating that the first metallic element is substituted by the second metallic element. Further, a desirable addition amount of the second metallic element is several mol % (for example, 5 mol %).

It is required that this branching suppression layer 17b does not contact with the upper electrode 19a. This is because the forming process cannot be easily performed when it contacts with the upper electrode 19. For this reason, it is desirable that the branching suppression layer 17b is arranged at a distance of about 0.1 nm to 3 nm apart from the upper electrode 19a. In the exemplary embodiment, as mentioned above, the film thickness of the variable resistance layer 17c is set to 0.1 nm to 3 nm in order to separate them from each other.

Further, it is required that the branching suppression layer 17b does not contact with the lower electrode 15a. In a case in which the forming process is performed by applying a positive voltage on the lower electrode 15a, many germs of the current path required to perform the forming process are formed when an added substance is not used. The high voltage is required to perform the forming process when the branching suppression layer 17b contacts with the lower electrode 15a. Therefore, it is important that the branching suppression layer 17b does not contact with the lower electrode 15a.

Thus branching suppression effect of the current path can be interpreted as follows from a physical property point of view. In order to change the state of the connection between two wirings L1 and L2 as shown in FIG. 1, a variable resistance element 50 as shown in FIG. 2 is provided.

In order to use this variable resistance element as a switch, the variable resistance element has to have a large on/off resistance ratio and a resistance value state has to be changed by an appropriate operation voltage. In particular, a voltage (hereinafter, described as a forming voltage VF) required for first changing the state of the variable resistance element from the initial high-resistance state to the low-resistance state is the highest one in the operation. Therefore, the small forming voltage VF is required.

Figure 5:
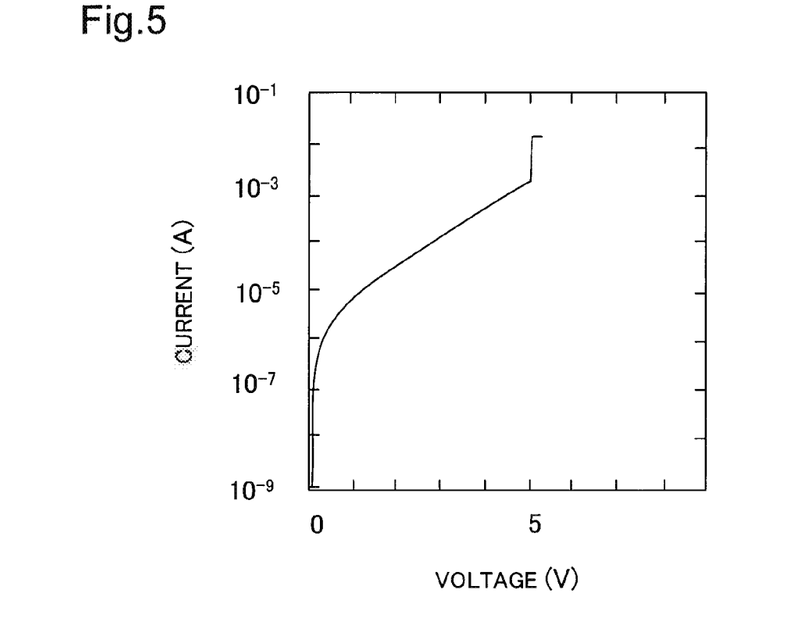
FIG. 5 is a figure showing a voltage-current characteristic of a variable resistance element produced by using a pure NiO film as a metal oxide film related to a metal oxide film according to an exemplary embodiment.
Figure 6:
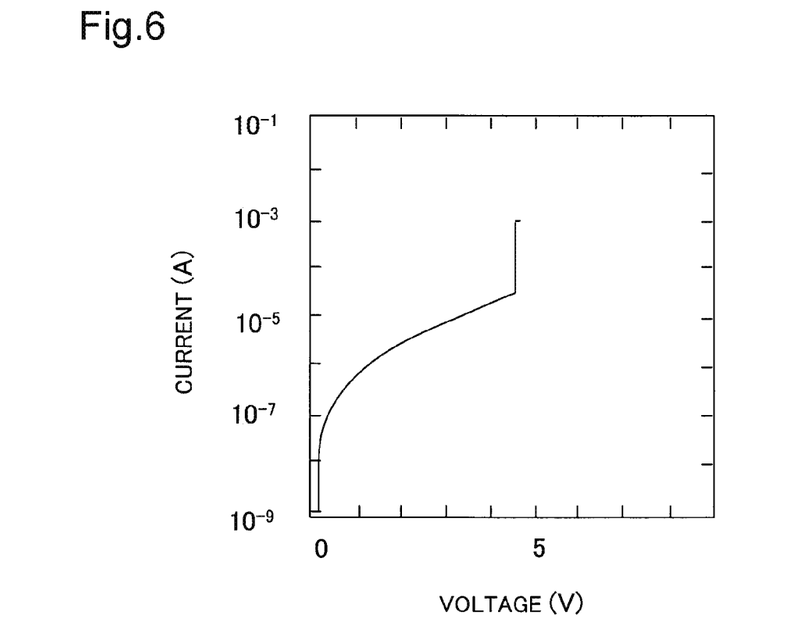
FIG. 6 is a figure showing a voltage-current characteristic of a variable resistance element produced by using a metal oxide film according to an exemplary embodiment.

FIG. 5 shows a typical voltage-current characteristic of a publicly known MIM type variable resistance element produced by using a pure NiO film as a metal oxide film. In contrast, FIG. 6 shows a voltage-current characteristic of an MIM type resistance element according to the present invention. Hereinafter, the variable resistance element having the characteristic shown in FIG. 5 is described as a publicly known variable resistance element and the variable resistance element having the characteristic shown in FIG. 6 is described as the variable resistance element of the present invention.

From the characteristic graphs shown in FIG. 5 and FIG. 6, the initial resistance of the variable resistance element of the present invention is higher than the initial resistance of the publicly known variable resistance element and the forming voltage VF of the variable resistance element of the present invention is approximately equal to that of the publicly known variable resistance element. It is believed that this difference arises from the presence of the branching suppression layer mentioned above.

Figure 7:
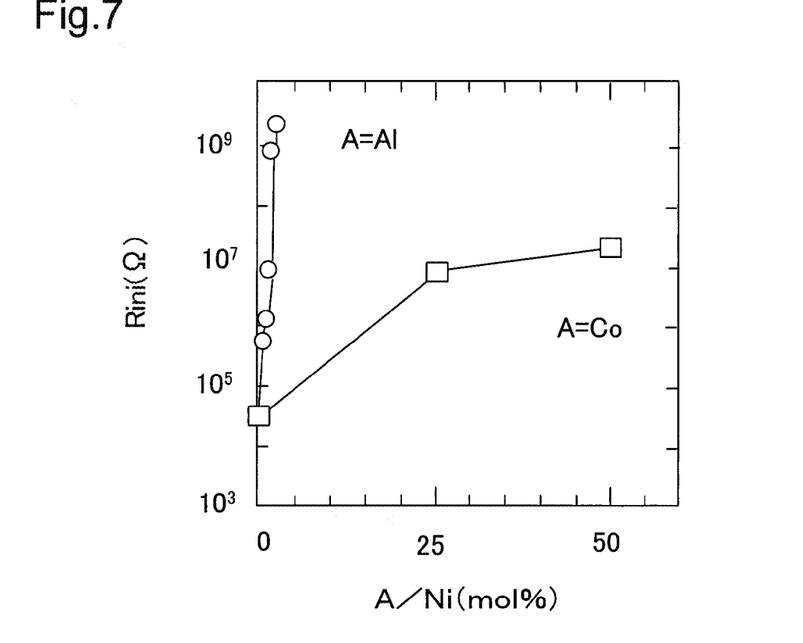
FIG. 7 is a figure showing an initial resistance of a variable resistance element produced by a metal oxide film of which Al or Co is added to NiO according to an exemplary embodiment.
Figure 8:
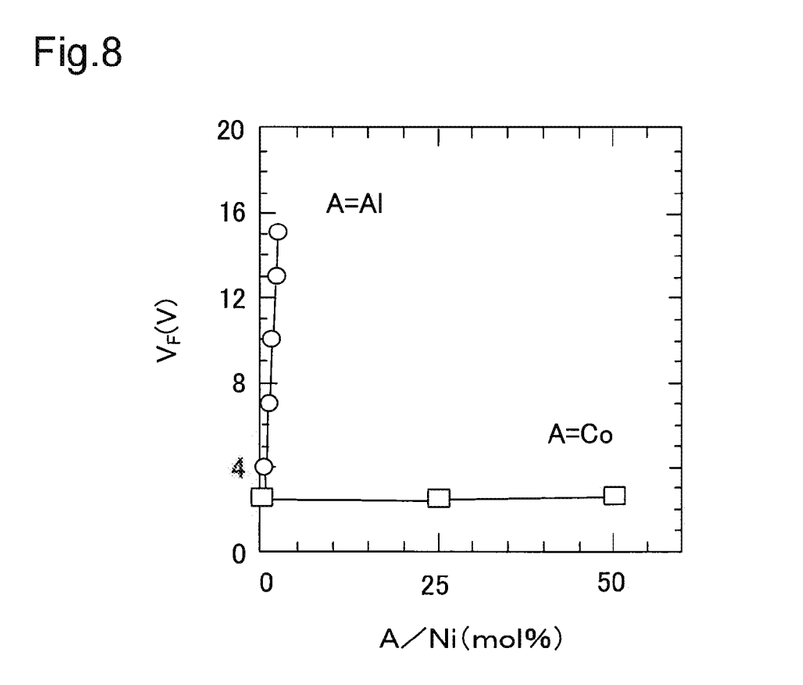
FIG. 8 is a figure showing a forming voltage of a variable resistance element produced by a metal oxide film of which Al or Co is added to NiO according to an exemplary embodiment.

FIG. 7 and FIG. 8 are figures showing an initial resistance Rin versus an addition amount and the forming voltage VF versus the addition amount with respect to the variable resistance element of the present invention produced by the metal oxide film of which Co (cobalt) is added to NiO and the publicly known variable resistance element produced by the metal oxide film of which Al (aluminum) is added to NiO, respectively. Further, in FIG. 7 and FIG. 8, the horizontal axis is a ratio of Ni to an addition material (Al or Co) in mol %. The film thickness (it roughly corresponds to the film thickness of the NiO layer) of each metal oxide film is 20 nm.

When Al is added, as shown in FIG. 7, the initial resistance Rin can be increased by adding several mol percent of the addition material. However, as shown in FIG. 8, the forming voltage VF becomes extremely high.

In contrast, when Co is added, the initial resistance Rin can be increased like a case of adding Al. However, the increased amount of the initial resistance Rin when Al is added is a little bit greater than the increased amount of the initial resistance Rin when Co is added. However, the forming voltage VF at a room temperature when Co is added is almost equal to the forming voltage VF at a room temperature when Al is added.

The parent metal of the branching suppression layer 17b including the first metallic element (that is Ni in this description) has a NiO crystal structure. By substituting this Ni element by the second metallic element, a large ionic bonding property to an oxygen ion is obtained around the substitution site and the crystal structure becomes stable. Accordingly, the movement of the Ni ion (Ni deficit) required for the growth of the current path scarcely occurs and the branching of the current path is suppressed. Even when the deficit of the first metallic element such as the Ni element or the like occurs by the second metallic element that is the added element, a charge neutral condition can be easily satisfied inside the branching suppression layer 17b. Therefore, the generation of the hole is suppressed. This means that the quantity of the holes that promotes the branching of the current path is suppressed. As a result, the branching of the current path is suppressed. When the branching of the current path is suppressed, the growth of the current path disproportionately occurs in the most electric field concentrated direction. As a result, the current path reaches the upper electrode without being branched.

As described above, because the branching of the current path is suppressed by the branching suppression layer, the variable resistance element whose characteristic value in the high-resistance state and the low-resistance state is stable can be obtained.

Further, the invention of the present application is not limited to the above-mentioned exemplary embodiment (and the example). Various changes in the configuration or details of the invention of the present application that can be understood by those skilled in the art can be made without departing from the scope of the invention.

This application claims priority based on Japanese Patent Application No. 2011-060327 filed on Mar. 18, 2011, the disclosure of which is hereby incorporated by reference in its entirety.

DESCRIPTION OF SYMBOL 2 semiconductor storage device
3 transistor
4 variable resistance element
15 lower electrode portion
15a lower electrode
15b barrier layer
17 metal oxide layer
17a variable resistance layer
17b branching suppression layer
17c variable resistance layer
19 upper electrode portion
19a upper electrode
19b barrier layer
41 barrier property insulator

The invention claimed is:

1. A variable resistance element, comprising:
a metal oxide layer having a variable resistance, sandwiched between a pair of electrodes, the metal oxide layer comprising:
  a pair of variable resistance layers having resistances which change by formation of a current path; and
  a branching suppression layer which is sandwiched between the variable resistance layers and suppresses branching of the current path,
wherein the variable resistance layer and the branching suppression layer include an oxide of a first metallic element that comprises at least one metallic element among Ni, Cu, and Co,
wherein the branching suppression layer further comprises a second metallic element that can be ionized into a trivalent or more state, the first metallic element being partially substituted with the second metallic element, and
wherein the second metallic element comprises at least one metallic element among Al, Ti, Zr, Hf, Ta, W, and Mo.

2. The variable resistance element described in claim 1, wherein an addition amount of the second metallic element is 0.01 mol % to 50 mol %.

3. The variable resistance element described in claim 1, wherein a film thickness of the variable resistance layer is set to a range from 0.1 nm to 3 nm.

4. The variable resistance element described in claim 1, wherein a film thickness of the variable resistance layer is set to a range from 0.1 nm to 1 nm.

5. The variable resistance element described in claim 1, wherein the variable resistance element is formed so as to sandwich a laminated body formed by stacking the electrode, the metal oxide layer, and the electrode and a barrier layer which restricts diffusion of the element included in these electrodes and the metal oxide layer is provided.

6. A semiconductor storage device, comprising:
the variable resistance element described in claim 1; and
a transistor connected to the variable resistance element,
wherein an electric current that flows into the transistor is limited by the variable resistance element or an operation state of the transistor is stored.

7. The semiconductor storage device described in claim 6, wherein a barrier property insulator which covers the variable resistance element is provided in the semiconductor storage device.

8. The variable resistance element of claim 1, wherein the pair of electrodes includes the first metallic element.

9. A variable resistance element, comprising:
a lower electrode portion;
a metal oxide layer having a variable resistance, formed on the lower electrode portion, the metal oxide layer comprising:
  a first variable resistance layer comprising an oxide of a first metallic element including at least one of Ni, Cu, and Co;
  a branching suppression layer formed on the first variable resistance layer for suppressing branching of a current path, the branching suppression layer comprising:
    an oxide of the first metallic element; and
    a second metallic element including at least one of Al, Ti, Zr, Hf, Ta, W, and Mo, the first metallic element being partially substituted with the second metallic element; and
  a second variable resistance layer formed on the branching suppression layer and comprising an oxide of the first metallic element; and
an upper electrode portion formed on the metal oxide layer.

10. The variable resistance element of claim 9, wherein the lower electrode portion comprises a first barrier layer and a lower electrode formed on the barrier layer, and
wherein the upper electrode portion comprises an upper electrode and a second barrier layer formed on the upper electrode.

11. A semiconductor storage device comprising:
a transistor formed on a substrate and including a diffusion region formed in the substrate;
an interlayer insulating film formed on the transistor and the substrate; and
a variable resistance element formed in the interlayer insulating film and electrically connected to the diffusion region of the transistor, the variable resistance element comprising:
  a lower electrode portion;
  a metal oxide layer having a variable resistance, formed on the lower electrode portion, the metal oxide layer comprising:
    a first variable resistance layer comprising an oxide of a first metallic element including at least one of Ni, Cu, and Co;

a branching suppression layer formed on the first variable resistance layer for suppressing branching of a current path, the branching suppression layer comprising:
an oxide of the first metallic element; and
a second metallic element including at least one of Al, Ti, Zr, Hf, Ta, W, and Mo, the first metallic element being partially substituted with the second metallic element; and
a second variable resistance layer formed on the branching suppression layer and comprising an oxide of the first metallic element; and
an upper electrode portion formed on the metal oxide layer.

12. The semiconductor storage device of claim 11, further comprising:
a barrier property insulator formed on the variable resistance element.

* * * * *